(12) United States Patent
Min et al.

(10) Patent No.: US 6,724,338 B1
(45) Date of Patent: Apr. 20, 2004

(54) METHOD AND APPARATUS FOR EARLY COMPARISON WITH A CONSTANT DELAY CIRCUIT

(75) Inventors: Byungmoo Min, Lexington, MA (US); Peter Kim, Cambridge, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/402,601

(22) Filed: Mar. 27, 2003

(51) Int. Cl.$^7$ ................................................ H03M 1/12
(52) U.S. Cl. .................... 341/155; 341/145; 341/156
(58) Field of Search .................... 341/155, 139, 341/156, 145; 327/83, 156, 276; 331/34

(56) References Cited

U.S. PATENT DOCUMENTS

| | | | | |
|---|---|---|---|---|
| 5,392,045 A | * | 2/1995 | Yee .............................. | 341/156 |
| 5,483,184 A | * | 1/1996 | Kuo ............................. | 327/83 |
| 5,559,473 A | * | 9/1996 | Anderson et al. ............. | 331/34 |
| 5,861,831 A | * | 1/1999 | Murden et al. ............. | 341/139 |
| 5,883,534 A | * | 3/1999 | Kondoh et al. ............. | 327/156 |
| 6,476,656 B2 | * | 11/2002 | Dally et al. .................. | 327/276 |

OTHER PUBLICATIONS

Byung–Moo Min, et al. "A 69mW 10b 80MS/s Pipelined CMOS ADC," ISSCC 2003/Session 18/NYQuinst A/D Converters/Paper 18.4, *2003 IEEE International Solid–State Circuits Conference*, and presentation slides, 26 pgs. (2003).

Specification Sheets, "ADC12L066 12–Bit,66 MSPS, 450 MHz Bandwidth A/D Converter with Internal Sample–and–Hold," *National Semiconductor Corporation*, 26 pgs. (Apr. 2002).

Specification Sheets, "ADC10080, 10–Bit, 80 MSPS, 3V, 78.6 mW A/D Converter," *National Semiconductor Corporation*, 18 pgs. (Jul. 2003).

* cited by examiner

*Primary Examiner*—Jean Jeanglaude
(74) *Attorney, Agent, or Firm*—Brett A. Hertzberg; Merchant & Gould (57) ABSTRACT

A method and apparatus are arranged to provide an early comparison scheme for a pipelined ADC stage with a delay circuit. The pipelined ADC includes an amplifier that is biased by a precision bias circuit. The delay circuit includes inverting stages, where each inverting stage includes one or more current sources. The delay circuit is configured to provide a latch signal in response to a clocking signal for the pipelined ADC stage. The latch signal is utilized by one or more comparators for early evaluation of the output of the pipelined ADC stage. The current sources in the delay circuit may also be biased by the precision bias circuit such that variations in amplifier performance are tracked by variations in the performance of the delay circuit. Process, temperature, and power supply related variations in the timing may be minimized by the biasing arrangement of the amplifiers and the delay circuit.

20 Claims, 5 Drawing Sheets

METHOD AND APPARATUS FOR EARLY
COMPARISON WITH A CONSTANT DELAY
CIRCUIT

FIELD OF THE INVENTION

The present invention is generally related to comparators in pipelined analog-to-digital converters (ADCs). More particularly, the present invention is related to an apparatus and method for early comparison of the output of a pipelined ADC with an improved delay cell to generate timing control for latching the comparison result.

BACKGROUND OF THE INVENTION

Analog-to-digital converters (ADCs) can be designed as a series of concatenated pipeline stages that each process one or more bits (e.g. 1-bit, 1.5-bits, 2-bits, etc.) of the conversion process. Each pipeline stage uses a sample-and-hold type of architecture that samples an analog input signal, processes the analog input signal using switched capacitor techniques, and provides the a set of output signals that can be processed by a comparator circuit and any subsequent pipeline ADC stages. During processing, the analog input signal is typically processed according to a transfer curve that uses switched capacitor scaling. The processed quantity corresponds to the conversion of one or more of the most significant bits. The residue of the conversion is passed on to subsequent stages, where further conversion of the analog input signal is provided. All of the comparison results are combined to provide a complete conversion of the analog input signal to a quantized digital value.

DETAILED DESCRIPTION OF THE PREFERRED EMBODIMENT

Throughout the specification and claims, the following terms take the meanings explicitly associated herein, unless the context clearly dictates othernvise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others. Referring to the drawings, like numbers indicate like parts throughout the views.

The present invention is generally related to comparators in pipelined analog-to-digital converters (ADCs). More particularly, the present invention is related to an apparatus and method for early comparison of the output of a pipelined ADC with an improved delay cell to generate timing control for latching the comparison result.

Briefly stated, a method and apparatus are arranged to provide an early comparison scheme for a pipelined ADC stage with a delay circuit. The pipelined ADC includes an amplifier that is biased by a precision bias circuit such as a bandgap reference circuit. The delay circuit includes inverting stages, where each inverting stage includes one or more current sources. The delay circuit is configured to provide a latch signal in response to a clocking signal for the pipelined ADC stage. The latch signal is utilized by one or more comparators for early evaluation of the output of the pipelined ADC stage. The current sources in the delay circuit may also be biased by the precision bias circuit such that variations in amplifier performance are tracked by variations in the performance of the delay circuit. Process, temperature, and power supply related variations in the timing may be minimized by the biasing arrangement of the amplifiers and the delay circuit.

Figure 1:
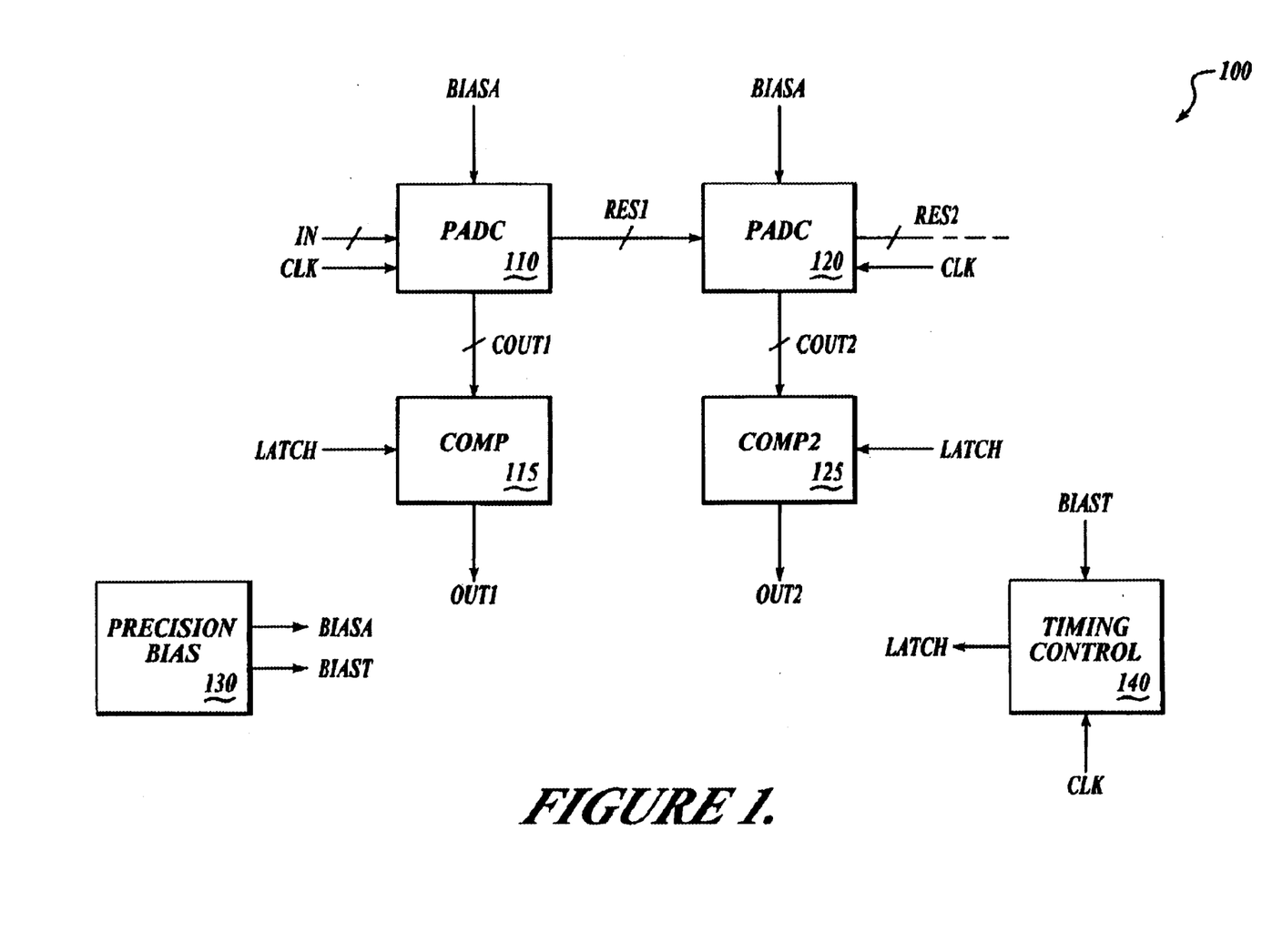
FIG. 1 is an illustrative system diagram of an embodiment of the present invention.

FIG. 1 is an illustrative system diagram (100) of an embodiment of the present invention. The diagram includes two pipeline analog-to-digital converter stages (PADC 110, PADC 120), two comparison circuits (COMP 115, COMP 125), a precision bias circuit (130), and a timing control circuit (140).

Each pipeline ADC includes a signal input terminal, a clock input terminal, a residue output terminal, and a comparison output terminal. PADC 110 receives clock signal CLK at the clock input terminal, IN at the signal input terminal, and provides RES1 and COUT1 at the residue and comparison output terminals, respectively. PADC 120 receives clock signal CLK at the clock input terminal, RES at the signal input terminal, and provides RES2 and COUT2 at the residue and comparison output terminals, respectively. Each comparison circuit includes a signal input terminal, a latch input terminal, and an output terminal. COMP 115 receives COUT1 at the signal input terminal, LATCH at the latch input terminal, and provides OUT1 at the output terminal. COMP 125 receives COUT2 at the signal input terminal, LATCH at the latch input terminal, and provides OUT2 at the output terminal. Although only two pipeline stages are illustrated in this example diagram (100), any number of pipeline stages and respective comparison circuits can be employed.

Precision bias circuit 130 may include one or more bias output terminals. For the example illustrated in FIG. 1, precision bias circuit 130 is configured to provide bias signals BIASA and BIAST. BIASA is a bias signal that may be employed to bias amplifiers in the pipeline ADC circuits. BIAST is a bias signal that may be employed to bias timing control circuit 140. Timing control circuit 140 includes a clock input terminal that receives clock signal CLK, a bias input terminal that receives bias signal BIAST, and a latch output terminal that provides latch signal LATCH.

In operation, timing control circuit 140 provides latch signal LATCH in response to clock signal CLK after a delayed time interval. The delayed time interval is responsive to bias signal BIAST. PADC 110 receives analog input signal IN and processes the signal according to internal timing signals that are generated from clock signal CLK. Comparison output signal COUT1, and residue signal RES1 result from the conversion operation of PADC 110. Comparison circuit 115 receives comparison output signal COUT1 and determines whether COUT1 has exceeded some predetermine level. Comparison circuit 115 provides a logical 1 output when COUT1 exceeds the predetermined level, and a logical 0 output when COUT2 is below the predetermined level. PADC 120 and comparison circuit 125 operate in the same manner as PADC 110 and comparison circuit 115.

The analog input signal may be either a single ended signal, or a differential signal. Comparison output signal COUT1 and COUT2 may also be either single ended signals, or differential signals. In one example, COUT1 and COUT2 are single ended signals and the predetermined level corresponds to a reference signal level (e.g., mid-supply). In another example, COUT1 and COUT2 are differential signals and the predetermined level corresponds to a minimum overdrive/offset characteristic associated with the comparison circuits based on polarity (e.g. more than 5 mV difference corresponds to logic 1, and less than 5 mV difference corresponds to logic 0).

Figure 2:
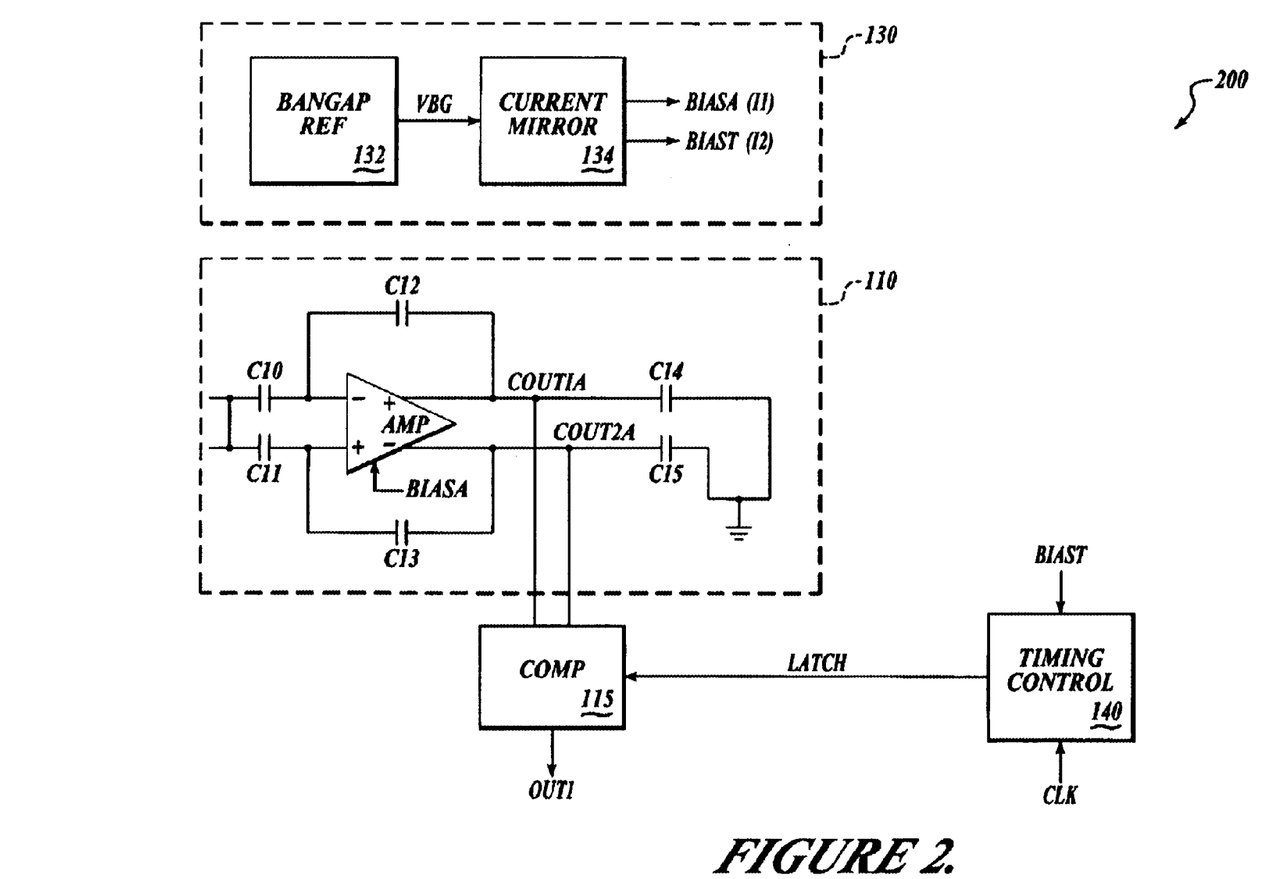
FIG. 2 is an illustrative schematic diagram for an operating state of a pipelined ADC converter that is arranged according to an embodiment of the present invention.

FIG. 2 is an illustrative schematic diagram (200) for an operating state of a pipelined ADC converter that is arranged according to of an embodiment of the present invention. Schematic diagram 200 includes pipeline ADC circuit 110, comparison circuit 115, precision bias circuit 130, and timing control circuit 140.

A partial view of pipeline ADC 110 (PADC 110) is shown in FIG. 2. The partial view includes capacitors C10–C15 and amplifier AMP configured in an equivalent operating state during the hold operating phase for the circuit. In a prior operating state, a differential analog input signal (IN) was sampled on capacitors C10 and C11. In the hold operating state, the sampled input signal is coupled to amplifier AMP such that capacitor pairs C10, C12 and C11, C13 scale the signal levels COUT1A and COUT1B. The signal levels are stored on capacitors C14 and C15, respectively, for further processing in the next pipeline stage (e.g., see FIG. 1A). Signal levels COUT1A and COUT1B are evaluated by comparison circuit 115 to determine an appropriate digital quantization for signal OUT1.

Precision bias circuit 130 includes a bandgap reference circuit (132), and a current mirror circuit 134. Bandgap reference circuit 132 is arranged to provide a bandgap voltage (VBG). The bandgap voltage (VBG) has reduced sensitivity to power supply and processing variations, as well as temperature compensation over specified temperature operating ranges. Current mirror circuit 134 is configured to receive the bandgap voltage (VBG) and provide biasing signals (BIASA, BIAST) as described previously with respect to FIG. 1. Bias signal BIASA provides biasing for a first current level (I1) in amplifier AMP of PADC 110, while BIAST provides biasing for a second current level (I2) in timing control circuit 140. In another example embodiment, the current mirror can be incorporated, in either whole or part, into at least one of band gap reference circuit 132, PADC 110, and timing control circuit 140.

Timing control circuit 140 is arranged to provide a delayed latch signal (LATCH) after the transition in the clock signal (CLK). Timing control circuit 140 is biased by bias signal BIAST such that the delay time between the transitions varies according to the bias condition.

In the hold mode, amplifier AMP will integrate charge on capacitors C12 and C13, while it also charges capacitors C14 and C15. The slew rate for amplifier AMP is determined by the operating current in the output stage of the amplifier, which is determined by biasing signal BIASA. Since amplifier AMP has limited current drive capabilities, the capacitors do not charge instantaneously and the amplifier goes into slew rate limiting until the settled valued of the voltages for COUT1A and COUT1B are approached.

Comparison circuit 115 continues to evaluate the values of COUT1A and COUT1B until the LATCH signal is asserted by timing control circuit 140. Optimally, the latch signal (LATCH) is asserted the moment that the amplifier has finished slewing to an acceptable settled (or final) value. Since the delay time through timing control circuit 140 is determined by bias signal BIAST and slew limiting for amplifier AMP is determined by bias signal BIASA, the latch signal should always occur after amplifier AMP has settled to its final value.

Figure 3:
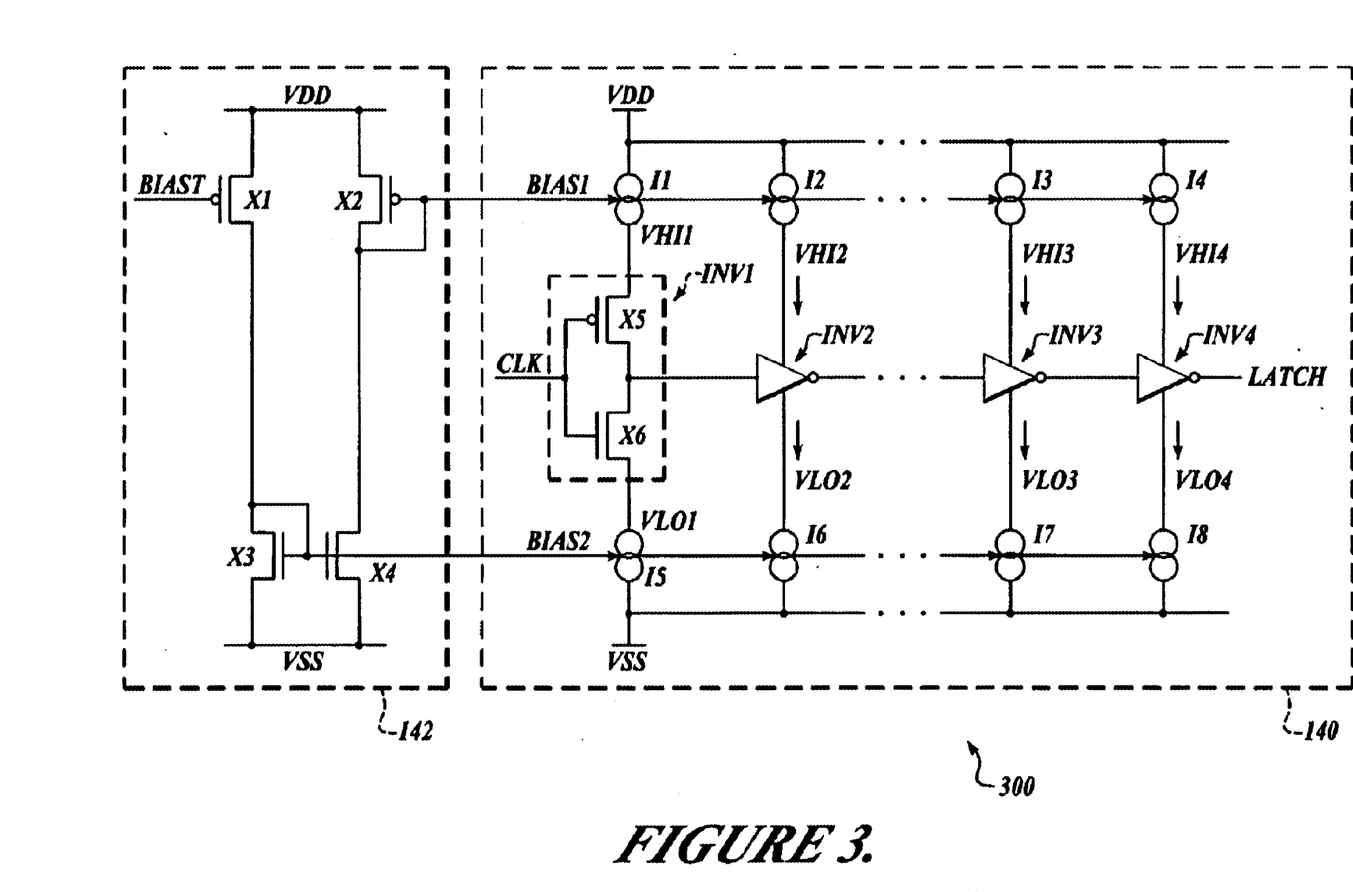
FIG. 3 is an illustrative schematic diagram of a timing control circuit that is arranged according to of an embodiment of the present invention.

FIG. 3 is an illustrative schematic diagram (300) of a timing control circuit that is arranged according to of an embodiment of the present invention. Schematic diagram 300 includes a timing control circuit 140, and a current mirror circuit 142.

Timing control circuit 140 includes current sources I1–I8, and inverter circuits INV1–INV4. Each inverter circuit has an operating current that is controlled by one or more current sources. An example CMOS type inverter circuit is illustrated as transistors X5 and X6. The inverter circuits are concatenated together into a delay circuit such that the output of each inverter circuit is driven into an input of a subsequent inverter circuits. Inverter circuit INV1 receives clock signal CLK and drives into the input of inverter circuit INV2. Similarly, inverter circuits INV2 and INV3 drive into the inputs of inverter circuits INV3 and INV4, respectively Inverter circuit INV4 provides the latch signal (LATCH).

For the example illustrated in FIG. 3, each inerter circuit has two current sources (one sourcing, and one sinking). Inverter circuit INV1 has a first current source (I1) that is coupled between VDD and VHI1, and a second current source (I5) that is coupled between VLO1 and VSS. Inverter circuit INV2 has a first current source (I2) that is coupled between VDD and VHI2, and a second current source (I6) that is coupled between VLO2 and VSS. Inverter circuit INV3 has a first current source (I3) that is coupled between VDD and VHI3, and a second current source (I7) that is coupled between VLO3 and VSS. Inverter circuit INV4 has a first current source (I4) that is coupled between VDD and VHI4, and a second current source (I8) that is coupled between VLO4 and VSS.

Current mirror circuit 142 includes transistors X1–X4, arranged in a mirror configuration. Current mirror circuit 142 receives bias signal BIAST and provides bias signals BIAS1 and BIAS2. Bias signal BIAS1 controls the current source levels for current sources I1–I4, while bias signal BIAS2 controls the current sink levels for current sources I5–I8. Bias signals BIAS1 and BIAS2 are arranged such that the current levels track bias signals BIAST, which is provided by precision bias circuit 130 (e.g., see FIG. 1).

In operation, the clock signal (CLK) is applied to the input of the first inverter circuit (INV1). The inverter circuits (e.g., INV1–INV4) are responsive to the clock signal (CLK) such that the latch signal (LATCH) will transition after a predetermined time interval has expired after the clock signal changes logic states. The control of the current (or currents) through each inverter circuit (e.g., INV1) is adjusted in response to one or more bias control signals (e.g., BIAS1 and BIAS2). The bias control signals are responsive to at least one biasing signal (e.g., BIAST) from the precision bias circuit (130) that is illustrated in FIG. 1.

A conventional inverter based delay circuit may be susceptible to deviations in the total delay time as a result operating parameter variations such as, for example, processing, temperature, and power supply variations. Timing control circuit 140 is arranged to operate over a variety of operating parameters with reduced sensitivity. The operating current of each inverter is responsive to the biasing signals (e.g., BIAST), which is provided by precision bias circuit 130 (see FIG. 1). An example biasing signal is provided by a bandgap reference circuit such that the biasing signal is relatively constant over the various process, temperature, and power supply conditions that may effect the circuits. By reducing the sensitivity to variations in the operating conditions (e.g., process, temperature, and power supply), the delay through the inverter circuits is also maintained as an approximately constant delay time.

The operating current for an amplifier in the pipelined ADC is related to the slew rate of the amplifier (e.g., see amplifier AMP in FIG. 2). Increasing the operating current of an amplifier will result in faster slewing, while decreasing the operating current of the amplifier will result in slower stewing. The operating current in the amplifiers (e.g., AMP) of the pipelined ADC circuits are biased via the precision bias circuit (130) as illustrated in FIGS. 1 and 2. Since the operating current in the amplifiers of the ADC(s) and the biasing of the inverter circuits of the timing and control circuit are both biased by the precision bias circuit, changes in the slew rate of the amplifiers track changes in delays for the timing and control circuit (140).

Figure 4A:
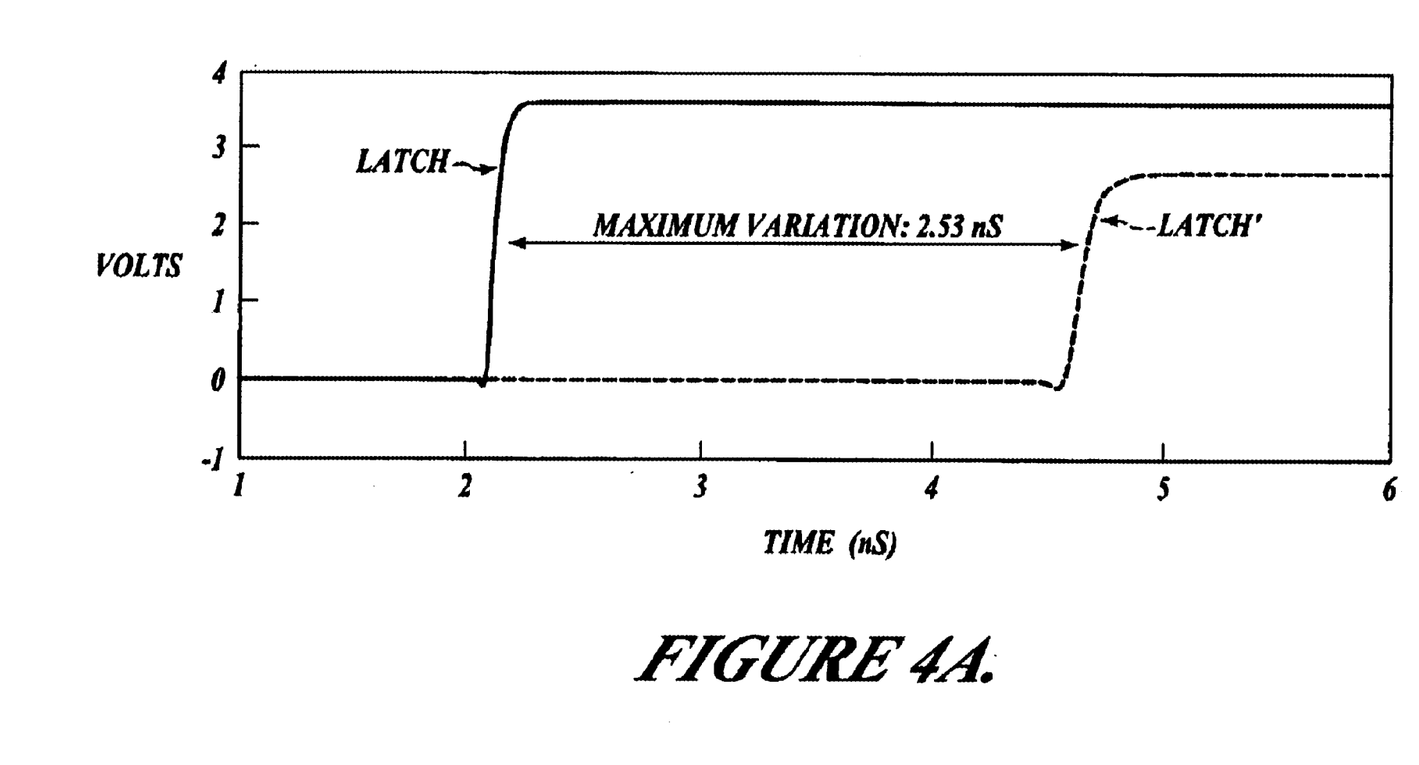
FIG. 4A is an illustrative timing diagram for a conventional delay circuit.

FIG. 4A is an illustrative timing diagram for a conventional delay circuit. A conventional delay circuit consists of conventional inverters that are series connected to one another to provide a delay between an input signal (e.g., a clock signal), and an output signal transition (e.g., a latch signal). Conventional inverter based circuits have various characteristics (e.g., propagation delay, rise time, fall time, etc.) that change due to operating conditions (e.g., processing variations, temperature variations, power-supply variations, etc.). The LATCH and LATCH' signals illustrated in FIG. 4A are associated with a representative spread in operating conditions. For example, the LATCH signal may be associated with the inverter based delay circuit with a first processing comer under a first power-supply and a first temperature condition, while the LATCH' signal may be associated with the inverter based delay circuit with a second processing comer under a second power-supply and a second temperature condition. The conventional inverter based delay circuit has a variation in delay times of approximately 2.53 nS over the various operating conditions as illustrated by LATCH and LATCH' in FIG. 4A.

Figure 4B:
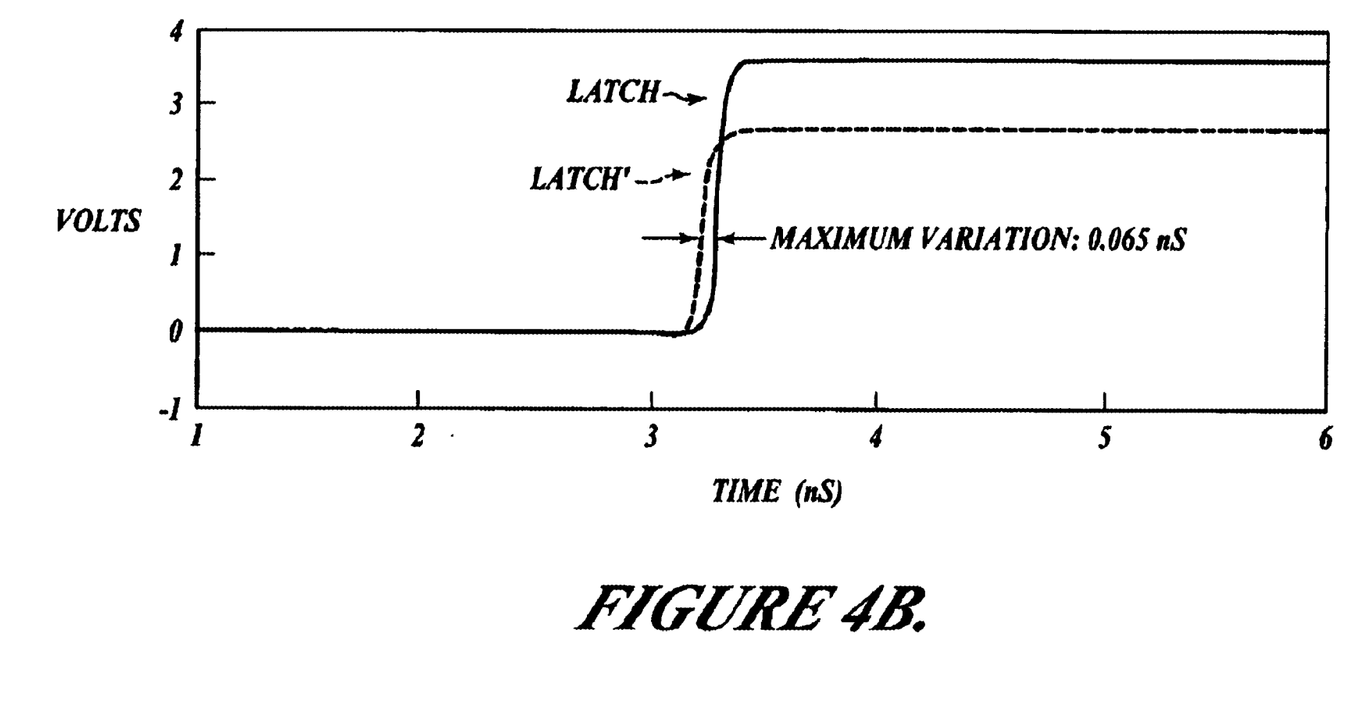
FIG. 4B is an illustrative timing diagram for a timing and control circuit that is arranged according to an embodiment of the present invention.

FIG. 4B is an illustrative timing diagram for a timing and control circuit that is arranged according to an embodiment of the present invention. The improved delay circuits that are found in the timing and control circuit of the present invention, are much less sensitive to operating conditions than the conventional inverter based circuits as illustrated by FIG. 4B. The LATCH and LATCH' signals illustrated in FIG. 4B are associated with the same representative spread in operating conditions as that described above with reference to FIG. 4A. The improved delay circuit that is found in the timing and control circuit of the present invention has a variation in delay times of approximately 0.065 nS over the various operating conditions as illustrated by LATCH and LATCH' in FIG. 4B.

An additional benefit of the above-described timing and control circuit architecture is that the delays can be arranged to track the performance of other circuitry by biasing the other circuitry with the precision bias circuit. For the example illustrated in FIG. 1, the pipelined ADC circuits are biased (at least in part) by the precision bias circuit such that variations in the performance of the pipelined ADCs are tracked by variations in the delays in timing and control circuit 140. For the example illustrated in FIG. 2, amplifier AMP in pipelined ADC circuit 110 is biased (at least in part) by precision bias circuit 130 such that variations in the performance of amplifier AMP is tracked by variations in the delays in timing and control circuit 140.

In one example, the slew rate of an amplifier (e.g., AMP) is related to the operating current in the amplifier (e.g., the tail current in the input stage, and/or the current in the output stage). An increase in operating current will result in faster slewing in the amplifier, while a decrease in operating current will result in slower stewing in the amplifier. The delays through the timing control circuit (e.g., 140) also increase with lower operating current and decrease with higher operating current. The variations in amplifier slewing and the variations in delay times track one another when the amplifier is biased (at least in part) by the precision bias circuit. For a pipelined ADC circuit such as illustrated in FIG. 2, comparator 115 evaluates the output of amplifier AMP when the latch signal (LATCH) is asserted. A decrease in the slew rate of the amplifier is matched by an increase in the delay of the latch signal (LATCH) such that operating speeds are decreased to reduce decision errors. Similarly, an increase in the slew rate of the amplifier is matched by a decrease in the delay of the latch signal (LATCH) such that higher operating speeds are achieved with reduced decision errors.

The examples described-above are merely representative examples of the application of the present invention. The total variation in the operating conditions (e.g., processing corners, temperature ranges, power-supply ranges, etc.) may be different for each particular system such that the absolute values of the delay times are different. However, the sensitivity of the delay circuits is reduced when the timing and control circuit methodologies described-above are employed.

The architecture of the timing and control circuit that is described above includes the use of a precision bias circuit (e.g., a bandgap circuit) such that variations in the operating conditions due not result in insubstantial variations in delay times. Although the example systems described-above are related to a pipelined ADC system, the applications of the timing and control circuit are not so limited.

The above specification, examples and data provide a complete description of the manufacture and use of the composition of the invention. Since many embodiments of the invention can be made without departing from the spirit and scope of the invention, the invention resides in the claims hereinafter appended.

We claim:
1. An apparatus, comprising:
   a precision bias circuit that is configured to provide a biasing signal; and
   a timing and control circuit that includes a first current source and a first inverter circuit, wherein the first current source is biased in response to the biasing signal, wherein the first inverter circuit is arranged to provide an output signal in response to a clock signal after a delay time, wherein the first inverter circuit is configured in cooperation with the first current source such that the delay time is associated with an operating current that is associated with the first current source, such that the sensitivity of the delay time to variations in operating conditions is reduced.

2. The apparatus as in claim 1, wherein the first inverter circuit is a CMOS inverter circuit that includes a p-type transistor and an n-type transistor, wherein the drain of the p-type transistor is coupled to the first current source.

3. The apparatus as in claim 1, wherein the first inverter circuit is a CMOS inverter circuit that includes a p-type transistor and an n-type transistor, wherein the drain of the n-type transistor is coupled to the first current source.

4. The apparatus as in claim 1, the timing and control circuit further comprising a second current source that is biased in response to the biasing signal, wherein the first inverter circuit is configured in cooperation with the second current source such that the delay time is also associated with another operating current that is associated with the second current source.

5. The apparatus as in claim 4, wherein the first inverter circuit is a CMOS inverter circuit that includes a p-type transistor and an n-type transistor, wherein the drain of the p-type transistor is coupled to the first current source, and wherein the drain of the n-type transistor is coupled to the second current source.

6. The apparatus as in claim 1, the timing and control circuit further comprising a second current source and a second inverter circuit, wherein the second current source is biased in response to the biasing signal, wherein the second inverter circuit is arranged to provide another output signal in response to the output signal from the first inverter circuit after another delay time, wherein the second inverter circuit is configured in cooperation with the second current source such that the other delay time is associated with another operating current that is associated with the second current source.

7. The apparatus as in claim 1, the precision bias circuit further comprising a bandgap reference circuit.

8. The apparatus as in claim 1, the variations in operating conditions further comprising at least one of: processing variations, temperature variations, and power-supply variations.

9. The apparatus as in claim 1, the variations in operating conditions further comprising at least one of: processing variations, temperature variations, and power-supply variations.

10. The apparatus as in claim 1, further comprising an amplifier circuit that is biased in response to the biasing signal such that changes in a slew rate of the amplifier circuit is tracked by changes in the delay time of the timing and control circuit.

11. The apparatus as in claim 10, further comprising a comparator circuit that is coupled to an output of the amplifier circuit, wherein the comparator circuit is configured to evaluate the output of the amplifier circuit in response to a latch signal, wherein the latch signal is associated with an output of the timing and control circuit.

12. The apparatus as in claim 1, further comprising a pipelined analog-to-digital converter circuit, and a comparator circuit that is coupled to an output of the pipelined analog-to-digital converter circuit, wherein the comparator circuit is configured to evaluate the output of the pipelined analog-to-digital converter circuit in response to a latch signal, wherein the latch signal is associated with an output of the timing and control circuit.

13. An apparatus, comprising:
a biasing means that is configured to provide a biasing signal with reduced sensitivity to operating conditions;
a current source means that is configured to provide an operating current that is responsive to the biasing signal; and
an inverting means that is configured to provide a delayed signal in response to an input signal after a delay time, wherein the inverting means is arranged in cooperation with the current source means such that the delay time is associated with the operating current such that the sensitivity of the delay time to variations in operating conditions is reduced.

14. An apparatus as in claim 13, further comprising a comparison means that is arranged to evaluate a signal in response to a latch signal, wherein the latch signal is related to the delayed signal such that the time for evaluation by the comparison means is optimized.

15. An apparatus as in claim 13, further comprising an amplifier means that is biased by the biasing signal such that at least one operating parameter that is associated with the amplifier means is related to the biasing signal.

16. An apparatus as in claim 15, further comprising a comparison means that is arranged to evaluate an output of the amplifier means in response to a latch signal, wherein the latch signal is related to the delayed signal such that the time for evaluation by the comparison means is optimized.

17. An apparatus, comprising:
a biasing circuit that is arranged to provide a biasing signal with reduced sensitivity to operating conditions;
a delay circuit that is arranged to provide a latch signal in response to an input signal after a delay time has expired, wherein the delay circuit includes a plurality of inverter circuits, wherein each inverter circuit has an operating current that is controlled by at least one current source that is responsive to the biasing signal such that the delay time associated with the delay circuit has reduced sensitivity to operating conditions; and
a comparator circuit that is arranged to evaluate an output signal in response to the latch signal such that a time for evaluation of the output signal is optimized.

18. The apparatus of claim 17, further comprising a pipelined analog-to-digital converter circuit that is arranged to provide the output signal.

19. The apparatus of claim 18, wherein the pipelined analog-to-digital converter circuit includes an amplifier circuit that is biased in response to the biasing signal such that variations in the slewing of the amplifier circuit are tracked by variations in the delay time, whereby early evaluation is accomplished by the comparator circuit.

20. The apparatus of claim 17, further comprising a current mirror circuit that is arranged to provide biasing for each of the at least one current sources.

* * * * *

UNITED STATES PATENT AND TRADEMARK OFFICE
CERTIFICATE OF CORRECTION

PATENT NO. : 6,724,338 B1
DATED : April 20, 2004
INVENTOR(S) : Byungmoo Min et al.

It is certified that error appears in the above-identified patent and that said Letters Patent is hereby corrected as shown below:

Column 1,
Line 53, "clearly dictates othernvise" should read -- clearly dictates otherwise --

Column 5,
Line 19, "stewing." should read -- slewing. --
Lines 40 and 44, "processing comer" should read -- processing corner --

Column 6,
Line 14, "slower stewing" should read -- slower slewing --
Line 42, "conditions due" should read -- conditions do --

Signed and Sealed this

Sixteenth Day of November, 2004

JON W. DUDAS
*Director of the United States Patent and Trademark Office*